United States Patent

Harada et al.

[11] Patent Number: 6,001,483
[45] Date of Patent: Dec. 14, 1999

[54] MODIFIED ALKYL-TERMINATED ENCAPSULANT FOR SEMICONDUCTOR OF EPOXY RESIN AND POLYETHYLENE OXIDE

[75] Inventors: Tadaaki Harada; Shinjirou Uenishi; Hirokatsu Kouyama; Takahiko Maruhashi; Katsumi Shimada; Satoshi Tanigawa, all of Ibaraki, Japan

[73] Assignee: Nitto Denko Corporation, Ibaraki, Japan

[21] Appl. No.: 08/669,317

[22] PCT Filed: Nov. 7, 1995

[86] PCT No.: PCT/JP95/02262

§ 371 Date: Sep. 23, 1996

§ 102(e) Date: Sep. 23, 1996

[87] PCT Pub. No.: WO96/15191

PCT Pub. Date: May 23, 1996

[30] Foreign Application Priority Data

Nov. 9, 1994 [JP] Japan .................................. 6-275213
Aug. 11, 1995 [JP] Japan .................................. 7-205956

[51] Int. Cl.$^6$ .......................... B32B 27/18; B32B 27/26; B32B 27/38; C08L 63/00
[52] U.S. Cl. .......................... 428/413; 525/407; 525/501; 525/504; 525/508; 525/523; 525/533; 528/110
[58] Field of Search ........................... 428/413; 525/407; 528/110

[56] References Cited

U.S. PATENT DOCUMENTS 4,210,572  7/1980  Herman et al. ................... 260/40 R
4,479,887  10/1984  Seibert ............................ 252/309
4,628,080  12/1986  Corley ............................ 528/88

FOREIGN PATENT DOCUMENTS 6-228281  8/1994  Japan .

*Primary Examiner*—Robert E. Sellers
*Attorney, Agent, or Firm*—Armstrong, Westerman, Hattori, McLeland & Naughton

[57] ABSTRACT

A composition useful as an encapsulating material for photosemiconductor elements such as a photodetector or light emmitor comprises an epoxy resin, a hardener and at least one compound represented by the following general formula (1) or (2):

$$CH_3CH_2-(-CH_2-CH_2-)_x-CH_2-CH_2-O-(-CH_2-CH_2-O-)_n-Y_1 \quad (1)$$

$$[CH_3CH_2-(-CH_2-CH_2-)_x-CH_2-CH_2-O-(-CH_2-CH_2-O-)_n-RCOO-]_m-Y_2 \quad (2)$$

wherein $Y_1$ represents —H, —RCOOH, —COR' or —R'; R' is an alkyl group with not more than 30 carbon atoms; R is a divalent organic group; $Y_2$ represents a metal atom having a valence of at least one; the mean value for x is from 8–200; and n is set such that the weight ratio of the repeating unit —$CH_2$—$CH_2$—O— accounts for from 25–95% by weight based on the whole compound; and m is a positive integer corresponding to the valence of $Y_2$.

8 Claims, No Drawings

MODIFIED ALKYL-TERMINATED ENCAPSULANT FOR SEMICONDUCTOR OF EPOXY RESIN AND POLYETHYLENE OXIDE

FIELD OF THE INVENTION

The present invention relates to an epoxy resin composition effective for encapsulating a photosemiconductor element, the composition having superior mold releasability and transparency.

BACKGROUND OF THE INVENTION

Heretofore, an epoxy resin composition has been used as a material for encapsulating photosemiconductor elements such as a photodetector or a light emitter in view of superiority in transparency, moisture resistance and heat of such a composition.

However, in spite of superiority in transparency, a conventional epoxy resin composition has the defect that mold releasability drastically deteriorates when forming a photosemiconductor device by transfer molding a photosemiconductor element and an epoxy resin composition in a forming die. For this reason, various kinds of problems are caused. For example, a photosemiconductor device deforms, a package cracks, a photosemiconductor element and an encapsulating resin separate, or gold wires peel off from stress in mold releasing. Such problems are distinctly identified by a variety of life tests for photosemiconductor devices, however, generally such photosemiconductor devices are judged as insufficient before they are subjected to such life tests and treated separately as defectives.

For this reason, heretofore, countermeasures have been studied. For example, there is a method that a conventional mold releasing agent is preliminarily mixed in an epoxy resin composition as an encapsulating material. The addition of some kinds of the mold releasing agent to an epoxy resin composition makes it possible to produce a resin composition superior in transparency which is one of the important properties for a resin composition for encapsulating a photosemiconductor element. However, a resin composition superior both in transparency and mold releasability has not been developed. To the contrary, a resin composition for encapsulating which is superior in mold releasability can be produced by the addition of a mold releasing agent, but, however, causes a problem of deterioration in transparency. Thus, it is a current situation that an epoxy resin composition for encapsulating superior both in transparency and mold releasability has not been obtained.

OBJECT OF THE INVENTION

It is an object of the present invention to provide an epoxy resin composition for encapsulating a photosemiconductor element superior both in mold releasability from a forming die in transfer molding and in transparency.

DISCLOSURE OF THE INVENTION

In order to achieve the object mentioned above, the epoxy resin composition for encapsulating a photosemiconductor element in the present invention comprises the following components (A) to (C):
(A) an epoxy resin;
(B) a hardener; and
(C) at least one compound represented by the following general formula (1) or (2).

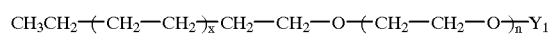

(1)

wherein
$Y_1$ represents —H, —RCOOH, —COR' or —R' wherein R is a bivalent organic group and R' is an alkyl group whose carbon number is not more than 30;
x represents a positive number of 8 to 200 and is a mean value; and
n is set in such a manner that the weight ratio of the repeating unit n accounts for 25 to 95% by weight based on the entire compound.

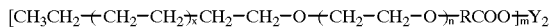

(2)

wherein
R represents a bivalent organic group,
$Y_2$ represents a metal atom having the valence of one or more,
m represents a positive integer corresponding to the valence of $Y_2$,
x represents a positive number of 8 to 200 and is a mean value; and
n is set in such a manner that the weight ratio of the repeating unit n accounts for 25 to 95% by weight based on the entire compound.

Namely, the inventors of the present invention have conducted a series of studies in order to obtain an epoxy resin composition for encapsulating a photosemiconductor element superior in both transparency and mold releasability. As a result of repeated tests by employing a variety of compounds to obtain good releasability without deteriorating transparency, it was found out that by employing at least either a specific compound represented by the general formula (1) or (2) as the component (C), an epoxy resin composition for encapsulating a photosemiconductor which is superior in both transparency and mold releasability can be obtained, thus achieving the present invention.

Particularly, by setting the content of the above component (C) at 0.01 to 15% by weight (just abbreviated to % hereinafter) based on the whole epoxy resin composition for encapsulating a photosemiconductor element so as to a decrease in glass transition temperature or moisture resistance reliability, sufficient mold releasability can be obtained.

The epoxy resin composition, generally in a state of powder or a tablet made therewith, for encapsulating a photosemiconductor element of the present invention can be obtained by employing an epoxy resin (component A), a hardener (component B) and a specific compound (component C), and adding a hardening accelerator according to the situation.

As the epoxy resin (component A), there is no specific limitation so long as it has good transparency. For example, there are cyclic epoxy resins containing nitrogen such as a bisphenol A epoxy resin, a bisphenol F epoxy resin, a phenol novolak epoxy resin, a cycloaliphatic epoxy resin, triglycidyl isocyanurate, a hydantoin epoxy resin and the like, a hydrogenated bisphenol A epoxy resin, an aliphatic epoxy resin, a glycidyl ether epoxy resin, a bisphenol S epoxy resin and the like. These are employed solely or in combination.

Among the above a various kinds of epoxy resins, it is preferable to employ a bisphenol A epoxy resin, a bisphenol F epoxy resin, a cycloaliphatic epoxy resin or triglycidyl isocyanurate in view of resistance to discoloration of an encapsulating resin (hardened material) after encapsulating a photosemiconductor element.

As a hardener (component B) employed together with the above epoxy resin (component A), there is no specific limitation so long as it has good transparency. However, it is preferable to employ a variety of acids anhydrides in view of less degree of discoloration of the encapsulating resin. Specifically, phthalic anhydride, maleic anhydride, trimellitic anhydride, pyromellitic anhydride, hexahydrophthalic anhydride, methyl nadic anhydride, nadic anhydride, glutaric anhydride, methyl hexahydrophthalic anhydride, methyl tetrahydrophthalic anhydride and the like may be listed. These are employed solely or in combination. Among them, it is preferable to employ phthalic anhydride, hexahydrophthalic anhydride, tetrahydrophthalic anhydride or methyl hexahydrophthalic anhydride. Moreover, a conventional hardener, for example, amines, phenols or carboxylic acids such as hexahydrophthalic acids, tetrahydrophthalic acids, methyl hexahydrophthalic acids and the like may be employed solely or in combination others than the above acids anhydrides.

As a mixing ratio of the above epoxy resin (component A) and the above hardener (component B), for example, when an acid anhydride is employed for the hardener, it is preferable to set 0.5 to 1.5 for acid anhydride equivalent per 1 equivalent of epoxy group in the above epoxy resin. Particularly, 0.7 to 1.2 is preferable. That is, when the acid anhydride equivalent of the above mixing ratio is below 0.5 equivalents, the hue of thus obtained epoxy resin deteriorates after hardening, in the meantime, when it is over 1.5 equivalents, moisture resistance tends to deteriorate. In addition, when the above mentioned amines, phenols or carboxylic acids are employed solely or in combination other than the acids anhydride as a hardener (component B), the mixing ratio is set in accordance with the mixing ratio (equivalent ratio) when the acid anhydride is employed.

A specific compound (component C) employed together with the components A and B is at least one compound represented by the following general formula (1) or (2). The addition thereof makes it easy to release a photosemiconductor device from a forming die when transfer molding with no damage in transparency of the encapsulating resin, which is the characteristic of this invention.

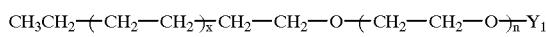
(1)

wherein $Y_1$ represents —H, —RCOOH, —COR' or —R' wherein R is a bivalent organic group and R' is an alkyl group whose carbon number is not more than 30;

x represents a positive number of 8 to 200 and is a mean value; and n is set in such a manner that the weight ratio of the repeating unit n accounts for 25 to 95% by weight based on the whole compound.

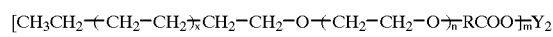
(2)

wherein

R represents a bivalent organic group, $Y_2$ represents a metal atom having the valence of one or more, m represents a positive integer corresponding to the valence of $Y_2$, x represents a positive number of 8 to 200 and is a mean value; and n is set in such a manner that the weight ratio of the repeating unit n accounts for 25 to 95% by weight based on the whole compound.

In the general formula (1), $Y_1$ is a hydrogen atom, —RCOOH (wherein R is a bivalent organic group), —COR' or —R' (wherein every R' is an alkyl group whose carbon number is not more than 30). Preferably, is a hydrogen atom, —RCOOH wherein R is alkylene group having 30 carbons or below, —COR' or —R' wherein R' is an alkyl group whose carbon number is 1 to 30.

Further, as a metallic atom of $Y_2$ in the general formula (2), for example, zinc, calcium, barium, aluminium, magnesium, lead, potassium, sodium and the like can be listed. Particularly, in view of transparency, it is preferable to employ calcium, sodium or zinc for $Y_2$.

Still further, both in the general formulae (1) and (2), the repeating numeral x is within a range of 8 to 200 and the repeating unit n is set in such a manner that the weight ratio of the repeating unit n accounts for 25 to 95% based on the whole compound represented by the general formulae (1) and (2) respectively. More preferably, the repeating numeral x is a positive number of 13 to 28 and the weight ratio of the repeating unit n is 35 to 85% both in the general formulae (1) and (2) respectively. Most preferably, the repeating numeral x is a positive number of 17 to 23 and the repeating unit n accounts for 45 to 70% both in the general formulae (1) and (2) respectively. In addition, when there are several kinds of compounds represented by the general formulae (1) and (2) respectively, the repeating numeral x is a mean value of every repeating numeral x respectively. Moreover, the weight ratio (%) of the repeating unit n is a value calculated from the following formula.

$$\frac{\text{(molecular weight of the repeating unit } n\text{)}}{\text{[molecular weight of compound represented by the general formula (1) or (2)]}} \times 100$$

In this want, as the compounds represented by the general formulae (1) and (2), those whose mean molecular weight is in the range of 300 to 300,000 are employed. Preferably, it is 600 to 12,000. More preferably, it is 900 to 5,000.

The compound represented by the general formula (1) can be obtained, for example, by adding ethylene oxide into higher alcohol.

Preferably, at least one compound (component C) represented by the general formula (1) or (2) is mixed so as to account for 0.01 to 15% based on the whole epoxy resin composition. More preferably, the mixing ratio is 0.1 to 5% and, most preferably, 0.5 to 3%. Namely, with lower mixing ratio of the component C, sufficient mold releasability from a forming die cannot be obtained when transfer molding, while with a higher mixing ratio, there is a possibility that a glass transition temperature or moisture resistance reliability may decrease.

Further, a hardening accelerator, a dye, a pigment, a modifier, an antioxidant, a coupling agent, a mold releasing agent and the like may appropriately be mixed in the epoxy resin composition for encapsulating a photosemiconductor element of the present invention other than the above components (A) to (C) within a range so as not to damage transparency.

As the above hardening accelerator, there is no specific limitation and any conventional type can be employed. For example, tertiary amines, imidazoles, quaternary ammonium salts and organometallic salts, and phosphorus compounds, 1,8-diazabicyclo [5,4,0]undec-7-ene and their derivatives can be listed. These are employed solely or in combination. Among these harding accelerators, it is preferable to employ tertiary amines or imidazoles. The mixing ratio of the hardening accelerator is preferably set within a range of 0.01 to 8 parts by weight (just abbreviated to part hereinafter) based on 100 parts of the epoxy resin (component A), more preferably, 0.1 to 3 parts. Namely, the mixing ratio below 0.01 parts thereof does not bring about a sufficient effect in hardening acceleration, while that over 8 parts may cause a possibility of discoloration in the encapsulating resin (hardened material).

As the above modifier, conventional types such as glycols, silicones and the like can be listed.

As the above antioxidant, conventional types such as phenol compounds, amine compounds, organic sulfur compounds, phosphinic compounds and the like can be listed.

As the above coupling agent, conventional types such as silanes, titanates and the like can be listed.

As the above mold releasing agent, conventional types such as long linear carboxylic acids such as stearic acid, behehic acid and montan acid, and their metallic salts, higher alcohols such as stearyl alcohol, amides such as stearyl bis amide, carnauba, esters such as phosphoric ester, paraffin wax and the like can be listed. The mixing ratio of such a mold releasing agent is generally said to be not more than 3% based on the whole resin composition, however, this is not critical so long as no deterioration in transparency may be caused as mentioned above.

Besides, when light dispersion property is required, a filler may be mixed in addition to the above components. As the filler, mineral fillers such as fused quartz powder, talc, silica powder, alumina powder and calcium carbonate can be listed.

As a suitable combination of each component for the epoxy resin composition for encapsulating a photosemiconductor element, in view of superior transparency and mold releasability, a bisphenol A epoxy resin, triglycidyl isocyanurate, a novolak epoxy resin or a cycloaliphatic epoxy resin as an epoxy resin (component A), tetrahydrophthalic anhydride or phthalic anhydride as a hardener (component B), tertiary amines or imidazols as a hardening accelerator of the other additive are employed together with compounds (component C) represented by the foregoing general formulae (1) and/or (2). At that time, each repeating numeral x in the formulae (1) and/or (2) is preferably a positive number of 13 to 28 and each repeating unit n preferably accounts for 35 to 85% based on the whole compound.

Among these combinations, the especially preferable combination is in view of a better effect to prevent discoloration of a hardened resin, a bisphenol A epoxy resin or triglycidyl isocyanurate as an epoxy resin (component A), tetrahydrophthalic anhydride as a hardening accelerator (component B) and imidazoles as the other additive are employed together with the compound (component c) represented by the general formulae (1) and/or (2) wherein the repeating numeral x is a positive number of 17 to 23 and the repeating unit n accounts for 45 to 70% based on the whole compound.

For example, the epoxy resin composition for encapsulating a photosemiconductor element of the present invention can be produced by the following manner. First, the above components (A) to (C), and according to the case, a hardening accelerator, a dye, a pigment, a modifier, an antioxidant, a coupling agent, a mold releasing agent, a filler and the like are blended at a specific ratio. The mixture is then mixed and kneaded by adopting a dry blend method or a fusion blend method appropriately in accordance with the usual way. Consecutively, it is cooled and cracked, and further tableted as needed, thus obtaining the epoxy resin composition.

A method for encapsulating a photosemiconductor element by employing such epoxy resin composition is not critical, and for example, a conventional mold method such as a transfer molding is available.

The thus obtained photosemiconductor device is superior in both transparency of the encapsulating resin and mold releasability when transfer molding, resulting in no bad effects due to inferior mold releasability heretofore on the photosemiconductor device.

Besides, in the present invention, as a hardened material of the encapsulating resin, preferably, light transmittance at 600 nm wave length is not less than 70% on a hardened material in 1 mm thickness, more preferably not less than 80% in accordance with a measurement of a spectrophotometer.

The invention will further be described in examples with reference to comparative examples.

EXAMPLES

First, compounds a to 1 shown in the following table 1 were prepared prior to examples. In addition, the compounds a to i are compounds represented by the above mentioned general formula. (1), wherein the last symbol $Y_1$ is a hydrogen atom.

Besides, in addition to the compounds a to l, compounds m to o shown in the following table 2 were prepared prior to examples. The compounds m to o are compounds represented by the above mentioned general formula (1).

Further, in addition to the compounds a to o, compounds p to r shown in the following table 3 were prepared. The compounds p to r are compounds represented by the general formula (2).

TABLE 1

| | COMPOUND REPRESENTED AS CHEMICAL FORMULA (1) | | | | |
|---|---|---|---|---|---|
| | REPEATING NUMERAL x | WEIGHT RATIO (%) OF REPATING UNIT n* | STRUCTURAL FORMULA | MEAN MOLECULAR WEIGHT | REPEATING UNIT n |
| a | 10 | 50.4 | | 742 | 8.5 |
| b | 14 | 49.8 | | 928 | 10.5 |
| c | 14 | 79.9 | | 2314 | 42.0 |
| d | 17 | 50.0 | | 1100 | 12.5 |
| e | 22 | 50.5 | $CH_3CH_2\!-\!(CH_2\!-\!CH_2)_{\overline{x}}\,CH_2\!-\!CH_2\!-\!O\!-\!(CH_2\!-\!CH_2\!-\!O)_{\overline{n}}\,H$ | 1394 | 16.0 |
| f | 69 | 50.0 | | 4008 | 45.5 |
| g | 14 | 19.1 | | 576 | 2.5 |
| h | 17 | 19.4 | | 682 | 3.0 |
| i | 22 | 20.3 | | 886 | 4.0 |
| j | behenic acid | | | | |
| k | carnauba wax | | | | |
| l | zinc stearate | | | | |

(*)NB: This weight ratio (%) was calculated based on the following formula.

$$\frac{\text{(molecular weight of repeating unit n)}}{\text{[molecular weight of a compound represented by the general formula (1)]}} \times 100$$

TABLE 2

| | COMPOUND REPRESENTED BY GENERAL FORMULA (1) | | | | | |
|---|---|---|---|---|---|---|
| | REPEATING NUMERAL x | WEIGHT RATIO (%) OF REPEATING UNIT n* | $Y_1$ in GENERAL FORMULA (1) | STRUCTURAL FORMULA | MEAN MOLECULAR WEIGHT | REPEATING UNIT n |
| m | 22 | 61.9 | $\overset{O}{\underset{\|}{C}}\!-\!CH_3$ | $CH_3CH_2\!-\!(CH_2\!-\!CH_2)_{\overline{x}}\,CH_2\!-\!CH_2\!-\!O\!-\!(CH_2\!-\!CH_2\!-\!O)_{\overline{n}}\,\overset{O}{\underset{\|}{C}}\!-\!CH_3$ | 1920 | 27 |
| n | 22 | 55.4 | $\overset{O}{\underset{\|}{C}}\!-\!C_{17}H_{35}$ | $CH_3CH_2\!-\!(CH_2\!-\!CH_2)_{\overline{x}}\,CH_2\!-\!CH_2\!-\!O\!-\!(CH_2\!-\!CH_2\!-\!O)_{\overline{n}}\,\overset{O}{\underset{\|}{C}}\!-\!C_{17}H_{35}$ | 2144 | 27 |
| o | 22 | 63.8 | $CH_2COOH$ | $CH_3CH_2\!-\!(CH_2\!-\!CH_2)_{\overline{x}}\,CH_2\!-\!CH_2\!-\!O\!-\!(CH_2\!-\!CH_2\!-\!O)_{\overline{n}}\,CH_2COOH$ | 2068 | 30 |

(*)NB: This weight ratio (%) was calculated based on the following formula.

$$\frac{\text{(molecular weight of repeating unit n)}}{\text{[molecular weight of a compound represented by the general formula (1)]}} \times 100$$

TABLE 3

| | COMPOUND REPRESENTED BY GENERAL FORMULA (2) | | | | | |
|---|---|---|---|---|---|---|
| | REPEATING NUMERAL x | WEIGHT RATIO (%) OF REPEATING UNIT n* | $Y_2$ in GENERAL FORMULA (2) | STRUCTURAL FORMULA | MEAN MOLECULAR WEIGHT | REPEATING UNIT n |
| p | 22 | 62.9 | Zn | $[CH_3CH_2\!-\!(\!CH_2\!-\!CH_2\!)_{\overline{x}}\!CH_2\!-\!CH_2\!-\!O\!-\!(\!CH_2\!-\!CH_2\!-\!O\!)_{\overline{n}}\!CH_2COO\,]_{\overline{2}}\,Zn$ | 4194 | 30 |
| q | 22 | 63.2 | Ca | $[CH_3CH_2\!-\!(\!CH_2\!-\!CH_2\!)_{\overline{x}}\!CH_2\!-\!CH_2\!-\!O\!-\!(\!CH_2\!-\!CH_2\!-\!O\!)_{\overline{n}}\!CH_2COO\,]_{\overline{2}}\,Ca$ | 4174 | 30 |
| r | 22 | 63.2 | Na | $CH_3CH_2\!-\!(\!CH_2\!-\!CH_2\!)_{\overline{x}}\!CH_2\!-\!CH_2\!-\!O\!-\!(\!CH_2\!-\!CH_2\!-\!O\!)_{\overline{n}}\!CH_2COONa$ | 2089 | 30 |

(*)NB: This weight ratio (%) was calculated based on the following formula.

$$\frac{\text{(molecular weight of repeating unit n)}}{\text{[molecular weight of a compound represented by the general formula (2)]}} \times 100$$

Then, epoxy resins A to D, hardeners E to C, hardening accelerators H to I and antioxidants J to L were prepared.

[Epoxy resin A]

Bisphenol A epoxy resin (epoxy equivalent: 650, melting point: 83° C.)

[Epoxy resin B]

Tris (2,3-epoxypropyl) isocyanurate (epoxy equivalent: 100, melting point: 110° C.)

[Epoxy resin C]

Cresol novolak epoxy resin (epoxy equivalent: 215, softening point: 92° C.)

[Epoxy resin D]

Cycloaliphatic epoxy resin represented by the following general formula (3) (epoxy equivalent: 187, softening point: 73° C.)

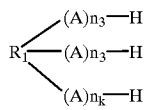

(3)

wherein $R_1$ represents trimethylolpropane residual group and A represents

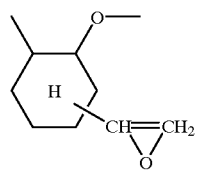

[Hardener E]
Tetrahydrophthalic anhydride
[Hardener F]
Diaminodiphenyl methane
[Hardner G]
Phenol novolak resin (hydroxyl group equivalent: 105, softening point: 72° C.)

[Hardening accelerator H]

2-ethyl-4-melthylimidazole

[Hardening accelerator I]

Dimethylbenzyl amine

[Hardening accelerator J]

2,6-di-tert-butyl-hydrotoluene represented by the following structural formula (4)

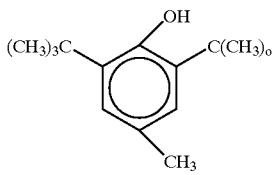

(4)

Triphenyl phosphite represented by the following structural formula (5)

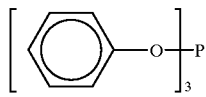

(5)

9,10-dihydro-9-oxa-10-phosphaphenanthrene-10-oxide

Examples 1 to 27 and Comparative Examples 1 to 6

Each component shown in tables 4 to 8 was mixed at a specified ratio shown therein. The mixture was fusion-kneaded at 80 to 130° C. by a mixing roller. After being cured, the mixture was cooled at a room temperature and crushed, thus obtaining powdery epoxy resin composition as an object.

TABLE 4

(parts)

| | EXAMPLES | | | | | | |
|---|---|---|---|---|---|---|---|
| | 1 | 2 | 3 | 4 | 5 | 6 | 7 |
| EPOXY RESIN | | | | | | | |
| A | 72.5 | 72.5 | 72.5 | 72.5 | 80 | 80 | 80 |
| B | 27.5 | 27.5 | 27.5 | 27.5 | 20 | 20 | 20 |
| C | — | — | — | — | — | — | — |
| D | — | — | — | — | — | — | — |
| HARDENER | | | | | | | |
| E | 55.2 | 55.2 | 55.2 | 55.2 | 44.2 | 44.2 | 44.2 |
| F | — | — | — | — | — | — | — |
| G | — | — | — | — | — | — | — |
| HARDENING ACCELERATOR | | | | | | | |
| H | 0.4 | 0.4 | 0.4 | 0.4 | 0.4 | 0.4 | 0.4 |
| I | — | — | — | — | — | — | — |
| ANTIOXIDANT | | | | | | | |
| J | 1.0 | 1.0 | 1.0 | 1.0 | 1.0 | 1.0 | 1.0 |
| K | 1.0 | 1.0 | 1.0 | 1.0 | 1.5 | 1.5 | 1.5 |
| L | — | — | — | — | — | — | — |
| COMPOUND | | | | | | | |
| a | 1.6 | — | — | — | — | — | — |
| b | — | 1.6 | — | — | — | — | — |
| c | — | — | 8.3 | — | — | — | — |
| d | — | — | — | 1.6 | 4.5 | — | — |
| e | — | — | — | — | — | 0.44 | 0.74 |
| CONTENT OF COMPOUND (%) | 1.0 | 1.0 | 5.0 | 1.0 | 3.0 | 0.3 | 0.5 |

TABLE 5

(parts)

| | EXAMPLES | | | | | | | |
|---|---|---|---|---|---|---|---|---|
| | 8 | 9 | 10 | 11 | 12 | 13 | 14 | 15 |
| EPOXY RESIN | | | | | | | | |
| A | 80 | 80 | 100 | — | 55 | 60 | 80 | 80 |
| B | 20 | 20 | — | — | — | — | 20 | 20 |
| C | — | — | — | 100* | 45 | — | — | — |
| D | — | — | — | — | — | 40 | — | — |
| HARDENER ACCELERATOR | | | | | | | | |
| E | 44.2 | 44.2 | — | — | 46.2 | 37.2 | 44.2 | 44.2 |
| F | — | — | 7.6 | — | — | — | — | — |
| G | — | — | — | 50 | — | — | — | — |
| HARDENING ACCELERATOR | | | | | | | | |
| H | 0.4 | 0.4 | — | 0.4 | — | — | 0.4 | 0.4 |
| I | — | — | — | — | 0.8 | 0.8 | — | — |
| ANTI-OXIDANT | | | | | | | | |
| J | 1.0 | 1.0 | 1.0 | 1.0 | 1.0 | 1.0 | 1.0 | 1.0 |
| K | 1.5 | 1.5 | — | — | — | — | 1.5 | 1.5 |
| L | — | — | 1.0 | 1.0 | 1.0 | 1.0 | — | — |
| COMPOUND | | | | | | | | |
| a | — | — | — | — | — | — | — | — |
| b | — | — | — | — | — | — | — | — |
| c | — | — | — | — | — | — | — | — |
| d | — | — | — | — | — | — | — | — |
| e | 4.5 | 7.7 | 3.4 | 4.7 | 4.6 | 4.3 | 16.4 | — |
| f | — | — | — | — | — | — | — | 0.15 |
| CONTENT OF COMPOUND (%) | 3.0 | 5.0 | 3.0 | 3.0 | 3.0 | 3.0 | 10.0 | 0.1 |

*NB: As for EXAMPLE 11, a cresol novalak type epoxy resin (epoxy equivalent; 215, softening point; 71° C.) was employed.

TABLE 6

(parts)

| | EXAMPLES | | | | | | | |
|---|---|---|---|---|---|---|---|---|
| | 16 | 17 | 18 | 19 | 20 | 21 | 22 | 23 |
| EPOXY RESIN | | | | | | | | |
| A | 80 | 80 | 80 | 80 | 80 | 80 | 80 | 80 |
| B | 20 | 20 | 20 | 20 | 20 | 20 | 20 | 20 |
| C | — | — | — | — | — | — | — | — |
| D | — | — | — | — | — | — | — | — |
| HARDENER | | | | | | | | |
| E | 44.2 | 44.2 | 44.2 | 44.2 | 44.2 | 44.2 | 44.2 | 44.2 |
| F | — | — | — | — | — | — | — | — |
| G | — | — | — | — | — | — | — | — |
| HARDENING | | | | | | | | |
| H | 0.4 | 0.4 | 0.4 | 0.4 | 0.4 | 0.4 | 0.4 | 0.4 |
| I | — | — | — | — | — | — | — | — |
| ANTI-OXIDANT | | | | | | | | |
| J | 1.0 | 1.0 | 1.0 | 1.0 | 1.0 | 1.0 | 1.0 | 1.0 |
| K | 1.5 | 1.5 | 1.5 | 1.5 | 1.5 | 1.5 | 1.5 | 1.5 |
| L | — | — | — | — | — | — | — | — |
| COMPOUND | | | | | | | | |
| m | 3.0 | — | — | — | — | — | — | — |
| n | — | 0.3 | — | — | — | — | — | — |
| o | — | — | 3.0 | — | — | — | 0.15 | 7.7 |
| p | — | — | — | 3.0 | — | — | — | — |
| q | — | — | — | — | 3.0 | — | — | — |
| r | — | — | — | — | — | 3.0 | — | — |
| CONTENT OF COMPOUND (%) | 2.0 | 0.2 | 2.0 | 2.0 | 2.0 | 2.0 | 0.1 | 5.0 |

TABLE 7

(parts)

| | EXAMPLES | | | | | |
|---|---|---|---|---|---|---|
| | 24 | 25 | 26 | 27 | 28 | 29 |
| EPOXY RESIN | | | | | | |
| A | 80 | 80 | 80 | 80 | 80 | 80 |
| B | 20 | 20 | 20 | 20 | 20 | 20 |
| C | — | — | — | — | — | — |
| D | — | — | — | — | — | — |
| HARDENER | | | | | | |
| E | 44.2 | 44.2 | 44.2 | 44.2 | 44.2 | 44.2 |

TABLE 7-continued

| | (parts) | | | | | |
|---|---|---|---|---|---|---|
| | EXAMPLES | | | | | |
| | 24 | 25 | 26 | 27 | 28 | 29 |
| F | — | — | — | — | — | — |
| G | — | — | — | — | — | — |
| HARDENING ACCELERATOR | | | | | | |
| H | 0.4 | 0.4 | 0.4 | 0.4 | 0.4 | 0.4 |
| I | — | — | — | — | — | — |
| ANTIOXIDANT | | | | | | |
| J | 1.0 | 1.0 | 1.0 | 1.0 | 1.0 | 1.0 |
| K | 1.5 | 1.5 | 1.5 | 1.5 | 1.5 | 1.5 |
| L | — | — | — | — | — | — |
| COMPOUND | | | | | | |
| e | — | — | — | — | 1.5 | 1.5 |
| q | 0.15 | 7.7 | — | — | 1.5 | — |
| r | — | — | 0.15 | 7.7 | — | 1.5 |
| CONTENT OF COMPOUND (%) | 0.1 | 5.0 | 0.1 | 5.0 | 2.0 | 2.0 |

TABLE 8

| | (parts) | | | | | |
|---|---|---|---|---|---|---|
| | COMPARATIVE EXAMPLES | | | | | |
| | 1 | 2 | 3 | 4 | 5 | 6 |
| EPOXY RESIN | | | | | | |
| A | 80 | 80 | 80 | 80 | 80 | 80 |
| B | 20 | 20 | 20 | 20 | 20 | 20 |
| C | — | — | — | — | — | — |
| D | — | — | — | — | — | — |
| HARDENER | | | | | | |
| E | 44.2 | 44.2 | 44.2 | 44.2 | 44.2 | 44.2 |
| F | — | — | — | — | — | — |
| G | — | — | — | — | — | — |
| HARDENING ACCELERATOR | | | | | | |
| H | 0.4 | 0.4 | 0.4 | 0.4 | 0.4 | 0.4 |
| I | — | — | — | — | — | — |
| ANTIOXIDANT | | | | | | |
| J | 1.0 | 1.0 | 1.0 | 1.0 | 1.0 | 1.0 |
| K | 1.5 | 1.5 | 1.5 | 1.5 | 1.5 | 1.5 |
| L | — | — | — | — | — | — |
| COMPOUND | | | | | | |
| g | 4.5 | — | — | — | — | — |
| h | — | 4.5 | — | — | — | — |
| i | — | — | 4.5 | — | — | — |
| j | — | — | — | 3.0 | — | — |
| k | — | — | — | — | 4.5 | — |
| l | — | — | — | — | — | 0.74 |
| CONTENT OF COMPOUND (%) | 3.0 | 3.0 | 3.0 | 2.0 | 3.0 | 0.5 |

As mentioned above, by employing thus obtained powdery epoxy resin composition in examples and comparative examples, a photosemiconductor element was transfer molded (molding conditions: 150° C.×4 minutes), and subsequently after-cured at 150° C. for 3 hours so as to produce photosemiconductor devices. Thus obtained photosemiconductor devices were evaluated in view of mold releasability from a forming die. The evaluation of the mold releasability was conducted on every forth shot's photosemiconductor device consecutively molded by transfer molding after cleaning molding with a melamine formaldehyde resin (Nippon Carbide Industries; Nikalet ECR, Grade AA). When a photosemiconductor device (package size: 19.8 mm×13.9 mm×2.8 mm thickness) could be taken out from a forming die (a cavity) with working an ejector pin only, the evaluation is ⊚. When being taken out with an ejector pin and air blasting, the evaluation is ○. When not being taken out with an ejector pin, air blasting and the like and being taken out additionally with mechanical force, resulting in deformation or cracking of the package, the evaluation is ×. The results are shown in the following tables 9 to 11.

Moreover, by employing each of the above epoxy resin compositions, a hardened material in 1 mm thickness was molded [hardening conditions: 150° C.×4 minutes+150° C.×3 hours (after cure)]. Light transmittance at 600 nm wave length was measured on thus obtained hardened material by a spectrophotometer (Shimadzu Corporation; UV-3101PC). The results are shown in the following tables 9 to 13.

TABLE 9

| | (parts) | | | | | | |
|---|---|---|---|---|---|---|---|
| | EXAMPLES | | | | | | |
| | 1 | 2 | 3 | 4 | 5 | 6 | 7 |
| MOLD RELEASABILITY | ○ | ○ | ○ | ○ | ⊚ | ○ | ○ |
| LIGHT TRANSMITTANCE (%) | 82.4 | 84.6 | 81.0 | 88.3 | 72.3 | 92.9 | 94.4 |

TABLE 10

| | (parts) | | | | | | | |
|---|---|---|---|---|---|---|---|---|
| | 8 | 9 | 10 | 11 | 12 | 13 | 14 | 15 |
| MOLD RELEASABILITY | ⊚ | ⊚ | ○ | ○ | ○ | ○ | ○ | ○ |
| LIGHT TRANSMITTANCE (%) | 95.2 | 95.6 | 78.0 | 91.3 | 94.0 | 94.8 | 96.0 | 73.0 |

TABLE 11

| | (parts) | | | | | | | |
|---|---|---|---|---|---|---|---|---|
| | EXAMPLES | | | | | | | |
| | 16 | 17 | 18 | 19 | 20 | 21 | 22 | 23 |
| MOLD RELEASABILITY | ○ | ○ | ○ | ○ | ○ | ○ | ○ | ○ |
| LIGHT TRANSMITTANCE (%) | 90.0 | 70.0 | 91.0 | 88.0 | 78.0 | 81.2 | 93.0 | 79.0 |

TABLE 12

| | (parts) | | | | | |
|---|---|---|---|---|---|---|
| | EXAMPLES | | | | | |
| | 24 | 25 | 26 | 27 | 28 | 29 |
| MOLD RELEASABILITY | ○ | ⊚ | ○ | ⊚ | ⊚ | ⊚ |
| LIGHT TRANSMITTANCE (%) | 85.0 | 72.0 | 90.0 | 73.0 | 85.0 | 88.0 |

TABLE 13

| | (parts) | | | | | |
|---|---|---|---|---|---|---|
| | COMPARATIVE EXAMPLES | | | | | |
| | 1 | 2 | 3 | 4 | 5 | 6 |
| MOLD RELEASABILITY | ⊚ | ⊚ | ⊚ | x | ⊚ | x |
| LIGHT TRANSMITTANCE (%) | 1.0> | 1.0> | 1.0> | 98.8 | 1.0> | 91.0 |

From results of the above tables 9 to 13, it is found out that all examples were high in light transmittance and superior in mold releasability. This shows that the examples are superior in both transparency and mold releasability. On the other hand, comparative examples 1 to 3 and 5 were good in mold releasability, however, very bad in light transmittance. Further, comparative examples 4 and 6 were high in light transmittance, however, very bad in mold releasability. In this way, comparative examples were good in either of light transmittance or mold releasability and bad in the other one. There were no comparative examples which showed satisfactory results in both properties.

EFFECTS OF THE INVENTION

As mentioned above, the epoxy resin composition for encapsulating a photosemiconductor element in the present invention contains at least one specific compound (component C) represented by the general formula (1) or (2). For this reason, the encapsulating resin by the epoxy resin composition retains high transparency and is also superior in mold releasability from a forming die when transfer molding and the like.

Particularly, by setting up the content of the above component (C) in the range of 0.01 to 15% based on the whole epoxy resin composition for encapsulating a photosemiconductor element, sufficient mold releasability can be obtained together with prevention of reduction in glass transition temperature or moisture resistance reliability.

Therefore, when encapsulating a photosemiconductor element with this epoxy resin composition, a photosemiconductor device with high reliability can be obtained without being handled as defects due to damages caused by bad mold releasability.

What is claimed is:

1. A photosemiconductor device made by encapsulating a photosemiconductor element with an epoxy resin composition comprising the following (A) to (C):

(A) an epoxy resin;
    (B) a hardener; and
    (C) at least one of compounds represented by the following general formula (1) or (2)

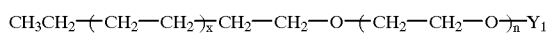

(1)

wherein

Y$_1$ represents —H, —RCOOH, —COR' or —R' wherein R is a bivalent organic group and R' is an alkyl group whose carbon number is riot more than 30;

x represents a positive number of 17 to 200 and is a mean value; and n is set in such a manner that the weight ratio of the repeating unit n accounts for 25 to 95% by weight based on the whole compound, or

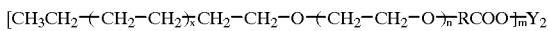

(2)

wherein

R represents a bivalent organic group,

Y$_2$ represents a metal atom having the valence of one or more, m represents a positive integer corresponding to the valence of Y$_2$, x represents a positive number of 8 to 200 and is a mean value; and n is set in such a manner that the weight ratio of the repeating unit n accounts for 25 to 95% by weight based on the whole compound.

2. A photosemiconductor device according to claim 1 wherein content of the component (C) is set within 0.01 to 15% by weight based on the whole epoxy resin composition.

3. A photosemiconductor device according to claim 1, wherein the repeating numeral x is a positive number of 17 to 28 and the repeating unit n is set in such a manner that the weight ratio off n accounts for 35 to 85% by weight based on the whole compound in the formula (1) and/or (2).

4. A photosemiconductor device according to claim 1, wherein the repeating numeral x is a positive number of 17 to 23 and the repeating unit n is set in such a manner that the weight ratio of n accounts for 45 to 70% by weight based on the whole compound in the formula (1) and/or (2).

5. A photosemiconductor device according to claim 1, wherein content of the component (C) is arranged so as to account for 0.1 to 5% by weight based on the whole epoxy resin composition.

6. A photosemiconductor device according to claim 1, wherein content of the component (C) is arranged so as to account for 0.5 to 3% by weight based on the whole epoxy resin composition.

7. A photosemiconductor device according to claim 1, wherein the component (A) is at least one epoxy resin selected from the group consisting of a bisphenol A epoxy resin, triglycidyl isocyanurate, a novolak epoxy resin and a cycloaliphatic epoxy resin, the component (B) is at least one of tetrahydrophthalic anhydride or phthalic anhydride, the component (C) is at least one compound represented by the formula (1) or (2) in which the repeating numeral x is a positive number of 17 to 28 and the repeating unit n accounts for 35 to 85% by weight based on the whole compound, and further a hardening accelerator comprising at least one of tertiary amines or imidazoles is mixed with the components (A) to (C).

8. A photosemiconductor device according to claim 1, wherein the component (A) is at least one of bisphenol A epoxy resin or triglycidyl isocyanurate, the component (B) is tetrahydrophthalic anhydride, and the component (C) is at least one compound represented by the formula (1) or (2) in which the repeating numeral x is a positive number of 17 to 23 and the repeating unit n accounts for 45 to 70% by weight based on the whole compound, and further imidazoles are mixed with the components (A) to (C) as a hardening accelerator.

* * * * *